United States Statutory Invention Registration [19]

[11] Reg. Number: H848

Emtage et al. [43] Published: Nov. 6, 1990

[54] METHOD OF PASSIVATING A SUBSTRATE SURFACE

[75] Inventors: Peter R. Emtage, Pittsburgh; Thomas A. Temofonte, Murrysville, both of Pa.

[73] Assignee: The United States of America as represented by the Secretary of the Army, Washington, D.C.

[21] Appl. No.: 396,395

[22] Filed: Aug. 17, 1989

[51] Int. Cl.[5] ..... H01L 21/20; H01L 21/469; C22C 38/22

[52] U.S. Cl. ..... 437/126; 437/234; 148/33.4

[58] Field of Search ..... 437/126, 234; 148/33.4

*Primary Examiner*—Peter A. Nelson

*Attorney, Agent, or Firm*—Michael J. Zelenka; Roy E. Gordon

[57] ABSTRACT

The surface of a substrate is passivated by the introduction of a thin layer of (Hg,Cd)Te, of increased Cd content, on the substrate surface before the growth of the desired composition of (Hg,Cd)Te.

10 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF PASSIVATING A SUBSTRATE SURFACE

The Government has rights in this invention under Contract No. DAAB07-86-C-F069 with the Department of the Army.

This invention relates in general to a method of passivation of a substrate surface, and in particular to the passivation of a substrate surface by the introduction of a thin layer of (Hg,Cd)Te, of increased Cd content, on the substrate surface before growth of the desired composition of (Hg,Cd)Te.

BACKGROUND OF THE INVENTION

The alloy family $Hg_{1-x}Cd_xTe$ has been used in infrared detection, the choice of the Cd fraction x allowing the choice of the infrared range. Both photoconductive and photovoltaic modes of detection have been used. Work has centered on growth by molecular beam epitaxy (MBE) and by metal-organic chemical vapor deposition (MOCVD). The compound has been grown on substrates of CdTe or lattice matched $Cd_{1-y}Zn_yTe$. X-ray analysis however, has shown the existence of a damage layer presumably associated with lattice mismatch at the growth interface when CdTe is the substrate. Similar, but weaker, damage is expected on (Cd,Zn)Te substrates, because composition control in available material is poor.

Recent studies have shown strong electrical activity near the growth interface of (Hg,Cd)Te grown by MBE on CdTe.

Large donor and trap densities of greater than $10^{17}/cm^3$ in roughly 300 angstroms have been inferred. Such properties must cause rapid recombination of photo-generated carriers near the interface, and degrade infrared response.

SUMMARY OF THE INVENTION

The general object of this invention is to provide a method of passivating a substrate surface. A more particular object of the invention is to provide a method of improving the efficiency of infrared devices by isolating the active layer from surface damage.

It has now been found that the aforementioned objects can be attained by the introduction of a passivating layer or thin layer of (Hg,Cd)Te of increased Cd content, on the substrate surface before growth of the photo-active layer of the desired composition of (Hg,Cd)Te.

The passivating layer can be thin and of about 500 to 1500 angstroms in thickness. However, the passivating layer must be thick enough to contain the damage layer.

The doping of the passivating layer should be the same type as that of the active layer, so that photogenerated minority carriers are reflected from it. The composition of the passivating layer should be close to that of the active layer, to avoid a new source of mismatch, but sufficiently far different to provide effective exclusion of minority carriers from the damage layer. For example, the Cd fraction for long wavelength detection is close to $x=0.21$. For operation at a temperature of 77° K, a composition of $x=0.27$ in the passivating layer is more than sufficient to cause electrical isolation of the active layer from the growth interface. Higher temperatures will require greater increases in the Cd content of the passivating layer over that of the active layer.

The passivating layer may be continuous with the active layer; a gradient in the Cd content, from high to low is expected to minimize damage in the active layer.

We wish it to be understood that we do not desire to be limited to the exact details of construction shown and described for obvious modifications will occur to a person skilled in the art.

What is claimed is:

1. Method of passivating a substrate surface to be used for growth of a photo-active layer of the alloy family $Hg_{1-x}Cd_xTe$ to be used in infrared detection, where choice of the Cd fraction x allows choice of infrared range, said method comprising growing a layer of relatively wide band gap (Hg,Cd)Te before growth of the photo-active layer.

2. Method according to claim 1 wherein the layers are grown by molecular beam epitaxy (MBE).

3. Method according to claim 1 wherein the layers are grown by metal-organic chemical vapor deposition (MOCVD).

4. Method according to claim 1 wherein the substrate is selected from the group consisting of CdTe and lattice matched $Cd_{1-y}Zn_yTe$.

5. Method according to claim 4 wherein the substrate is CdTe.

6. Method according to claim 4 wherein the substrate is lattice matched $Cd_{1-y}Zn_yTe$.

7. Method according to claim 1 wherein the passivating layer is about 500 to 1500 angstroms in thickness.

8. Method according to claim 1 wherein the doping of the passivating layer is the same type as that of the active layer.

9. Method according to claim 1 wherein the composition of the passivating layer should be close to that of the active layer.

10. Method according to claim 1 wherein the passivating layer is continuous with the active layer.

* * * * *